(12) United States Patent
Nakazawa et al.

(10) Patent No.: US 6,774,011 B2
(45) Date of Patent: Aug. 10, 2004

(54) CHIP PICKUP DEVICE AND METHOD OF MANUFACTURING SEMICONDUCTOR DEVICE

(75) Inventors: Takahito Nakazawa, Yokohama (JP); Tetsuya Kurosawa, Yokohama (JP); Hideo Numata, Yokohama (JP); Shinya Takyu, Kitakatsushika-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/920,628

(22) Filed: Aug. 3, 2001

(65) Prior Publication Data

US 2002/0019074 A1 Feb. 14, 2002

(30) Foreign Application Priority Data

Aug. 4, 2000 (JP) .......................................... 2000-237271

(51) Int. Cl.[7] .......................... H01L 21/46; H01L 21/78; H01L 21/301
(52) U.S. Cl. ......................................... 438/464; 438/113
(58) Field of Search ................................ 438/464, 460, 438/462, 110, 113; 156/344

(56) References Cited

U.S. PATENT DOCUMENTS

| 4,770,737 | A | * | 9/1988 | Seki | 156/584 |
| 4,859,269 | A | * | 8/1989 | Nishiguchi | 256/361 |
| 4,867,836 | A | * | 9/1989 | Hamamura et al. | 156/584 |
| 4,915,757 | A | * | 4/1990 | Rando | 156/64 |
| 5,000,814 | A | * | 3/1991 | Sumi | 156/344 |
| 5,098,501 | A | | 3/1992 | Nishiguchi | |
| 5,110,393 | A | * | 5/1992 | Sumi et al. | 156/344 |
| 5,169,196 | A | * | 12/1992 | Safabakhsh | 294/64.3 |
| 5,312,505 | A | * | 5/1994 | Sumi et al. | 156/584 |
| 5,351,872 | A | * | 10/1994 | Kobayashi | 228/6.2 |
| 5,358,591 | A | * | 10/1994 | Candore | 156/344 |
| 5,447,266 | A | * | 9/1995 | Misono | 228/102 |
| 5,589,029 | A | * | 12/1996 | Matsui et al. | 156/344 |
| 5,641,714 | A | * | 6/1997 | Yamanaka | 438/14 |
| 6,083,811 | A | * | 7/2000 | Riding et al. | 438/460 |
| 6,107,164 | A | * | 8/2000 | Ohuchi | 438/465 |
| 6,201,306 | B1 | | 3/2001 | Kurosawa et al. | |
| 6,338,980 | B1 | * | 1/2002 | Satoh | 438/106 |
| 6,500,298 | B1 | * | 12/2002 | Wright et al. | 156/344 |

FOREIGN PATENT DOCUMENTS

| JP | 9-181150 | 7/1997 |
| KR | 92-13705 | 7/1992 |
| KR | 94-10646 | 10/1994 |

\* cited by examiner

*Primary Examiner*—David A. Zarneke
(74) *Attorney, Agent, or Firm*—Finnegan, Henderson, Farabow, Garrett & Dunner, L.L.P.

(57) ABSTRACT

A pickup device comprises a thrusting mechanism, a carrying mechanism and a controller. The thrusting mechanism is configured to thrust the chips sequentially by using pins from a back side of the adhesive tape with the adhesive tape between the chips and the pins so as to peel the chips off the adhesive tape. The carrying mechanism is configured to sequentially absorb the chips with use of a collet, hold the chips to be absorbed until the chips are peeled off the adhesive tape, thereafter pick the chips up by ascending the collet in order to be carried the chips to a subsequent process stage. The controller is configured to controlling the thrust of the chip by thrusting mechanism, the controller control an ascend time and a descend time of the pins, and keeping a predetermined period of a time when the pins arrive at their peak.

6 Claims, 16 Drawing Sheets

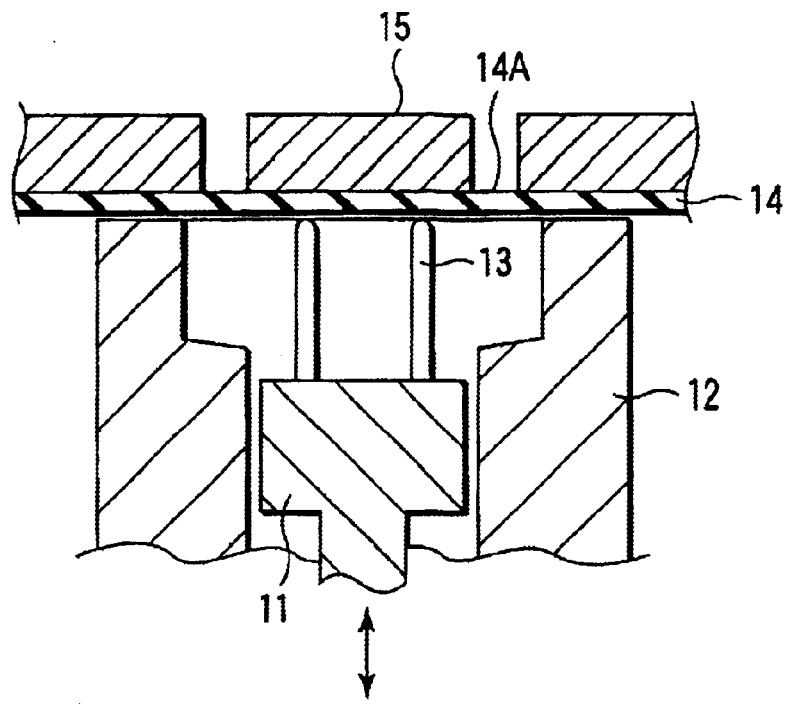
FIG. 1 PRIOR ART
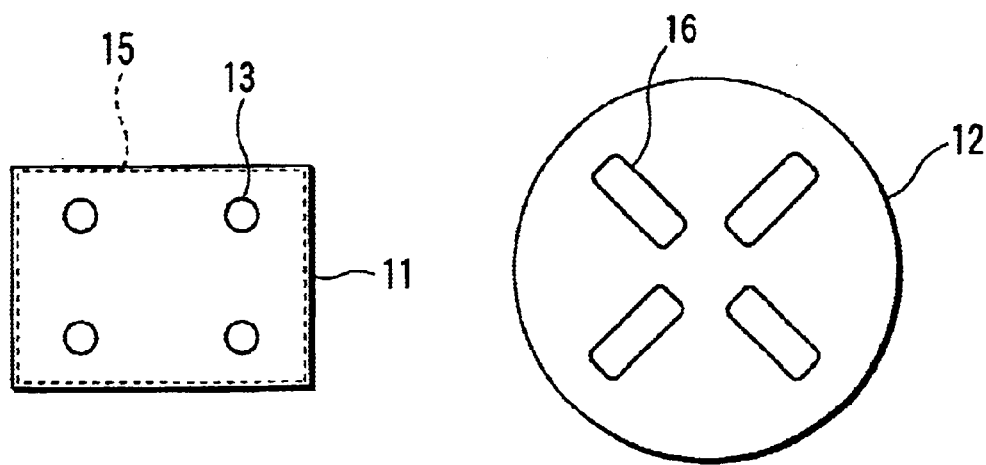
FIG. 2A
PRIOR ART
FIG. 2B
PRIOR ART

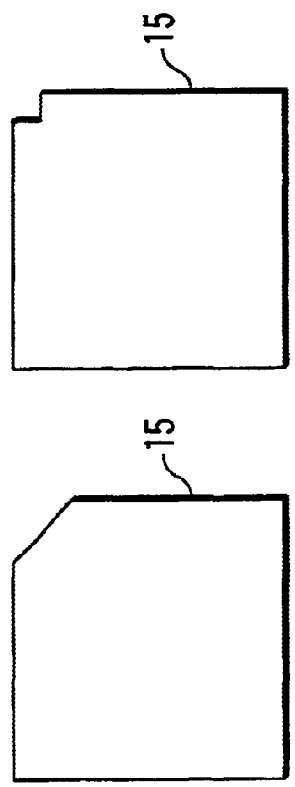
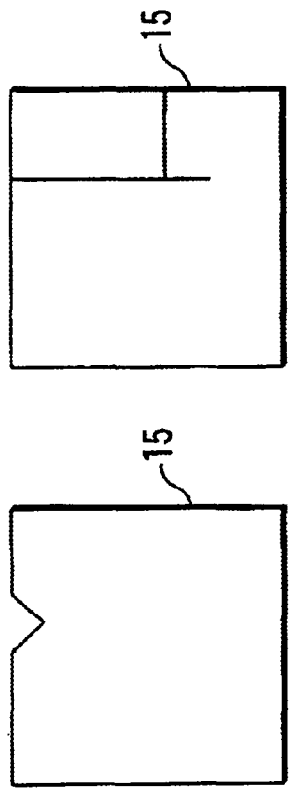
FIG.7A PRIOR ART
FIG.7B PRIOR ART
FIG.7C PRIOR ART
FIG.7D PRIOR ART
FIG.7E PRIOR ART
FIG.7F PRIOR ART
FIG.7G PRIOR ART
FIG.7H PRIOR ART

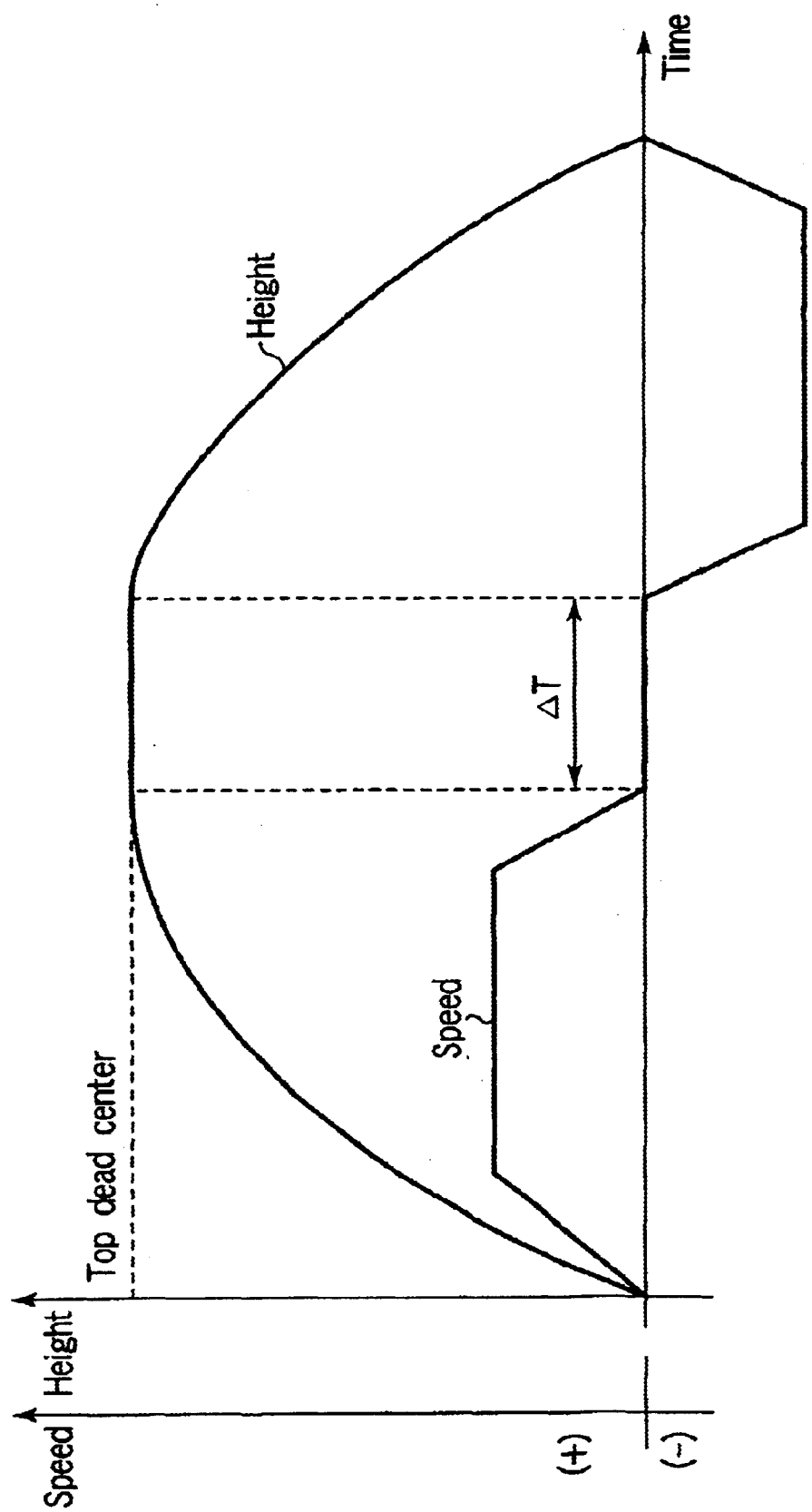
F I G. 13

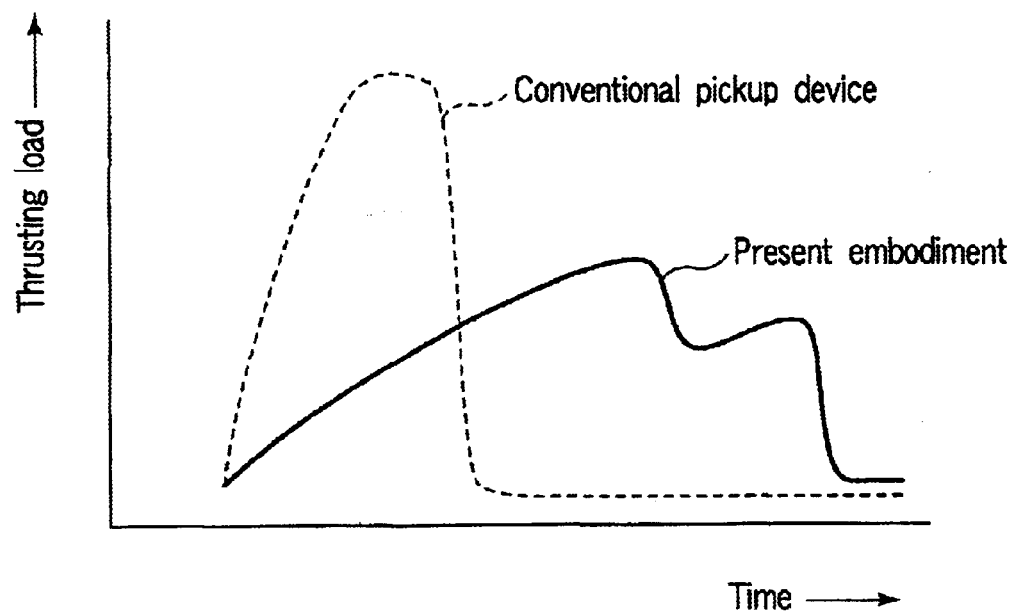
F I G. 14
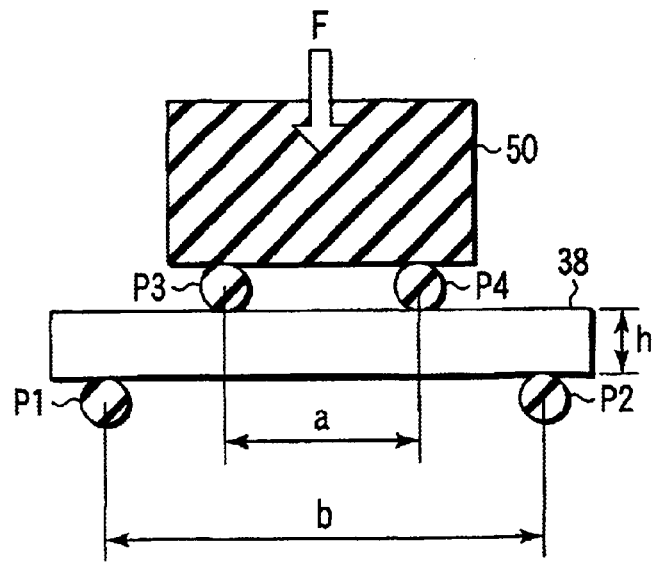
F I G. 15A

CHIP PICKUP DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2000-237271, filed Aug. 4, 2000, the entire contents of which are incorporated herein by reference.

BACKGROUND OF THE INVENTION

The present invention relates to a semiconductor device packaging technique, particularly to a chip pickup device and a method of manufacturing a semiconductor device used for a mounting process. More specifically, it relates to a chip pickup device and a method of manufacturing a semiconductor device for peeling chips obtained by dicing a wafer sequentially off an adhesive tape and carrying them in a process of packaging a thin chip used for an IC card, a TAG, or a three-dimensional package.

The semiconductor device used for an IC card or a portable electronic gear is limited in its mounting area and thickness. On the other hand, the functions required of the semiconductor device are now being varied more and more. In order to satisfy the requirements, the technique for mounting a semiconductor chip in a three-dimensional manner is advantageous and now being employed frequently. The three-dimensionally mounted semiconductor package is called as a stacked module, the thickness of which is equal to the conventional one. For example, the device having a flash memory and an SRAM stacked therein has already been distributed as a memory used in a portable electronic gear, and a three- or four-layered device is now being developed for distribution.

In order to mount a semiconductor chip in such a thin package, the chip conventionally having a thickness of 200 to 650 μm is now being required to be have a thickness of 200 μm or less. The chip used in the device having a flash memory and an SRAM stacked therein or the three- or four-layered device as mentioned above is formed as thin as 50 to 150 μm. Still further, a thin chip of 50 μm or less is now being demanded.

In accordance with the requirement for a thin chip, the chip is being formed very thin. However, the thinner the chip is formed, the more the cracks occur in picking up the chip, which is becoming a serious problem in the mounting process. The flexural strength of the chip is reported to be proportional to the square of the thickness of the chip. The thinner the chip is formed, the more the breaks or cracks occur in the chip.

In picking a thin silicon chip having a thickness of 40 to 200 μm up with use of the conventional pickup device, very many cracks occur in the chip. A "crack" means a breakage of the chip, or chipping of the periphery such as corners or edges of the chip.

A crack occurring in picking the chip up will be detailed below in conjunction with FIGS. 1, 2A, 2B, 3A to 3C, 4A to 4D, 5A to 5C, 6A to 6C, and 7A to 7H. FIG. 1 is a sectional view schematically showing a backup holder, a pin holder, and pins of the thrusting mechanism, for explaining the conventional pickup device and the method of manufacturing a semiconductor device. The pin holder 11 is formed to move vertically in the backup holder 12. When the pin holder ascends, the pins 13 thrust a chip 15 upwards with an adhesive tape therebetween to peel the chip 15 off an adhesive face 14A of the adhesive tape 14.

In general, the pins 13 are arranged symmetrically with respect to the center of the chip and along the diagonal of the chip as shown in FIG. 2A. On the upper face of the backup holder 12, through holes 16 from which the pins 13 project are formed to correspond to the arrangement of the pins, as shown in FIG. 2B.

FIGS. 3A to 3C respectively show how the conventional chip 15 having the thickness of 200 to 750 μm is thrusted up, and FIGS. 4A to 4D show step by step how the chip 15 is peeled off the adhesive tape 14 by the thrust. As shown in FIGS. 3A to 3C, when the pins 13 ascend, the chip 15 is peeled off the adhesive tape 14 gradually as shown in FIGS. 4A to 4C by the unshaded areas, and completely peeled at the step shown in FIG. 4D. In the peeling process, the periphery, particularly the corners of the chip are peeled off at first by the ascending of the pins (see FIG. 4B), the peeled area increases in the area other than that around the pins (see FIG. 4C), and when the pins arrive at the highest point, the chip is completely peeled off the adhesive tape (see FIG. 4D).

If the chip is as thin as 40 to 100 μm, however, the portions thrusted by the pins 13 ascend at first, and the other portions not thrusted by the pins 13 ascend behind the thrusted portions, as shown in FIGS. 5A to 5C. This is because, the chip 15 is formed so thin, and thus the chip is bent and not peeled off the adhesive tape 14. The chip remains not peeled as shown in FIGS. 6A and 6B, and thus cracks 16 occur finally. The cracks 16 occur due to the cleavage generated on the surface of the chip since the chip 15 is bent beyond the elastic limit of silicon. The cracks occurring on the surface of the chip may propagate to the rear side, and the chip 15 will be completely broken. The thinner the chip, the more the cracks occur.

FIGS. 7A to 7H respectively show the cracks of a particularly thin silicon chip having a thickness of 100 μm or less. The cracks can be classified roughly into three types: a "chipping" mode; a "break" mode; and a "penetration" mode. The "chipping" mode means the condition as shown in FIGS. 7A to 7C where the corners or periphery of the chip are chipped. The "break" mode means the condition as shown in FIGS. 7D to 7G where the cracks like lines occur. The "penetration" mode means the condition as shown in FIG. 7H where only the portions thrusted by the pins upheave and crack.

As described above, the damage such as a crack are generated in the thin chip in picking up the chip with use of the conventional pickup device and the conventional method of manufacturing the semiconductor device, thereby the quality of the chip is deteriorated or the yield is decreased.

BRIEF SUMMARY OF THE INVENTION

According to an aspect of the present invention there is provide a pickup device for transferring to an adhesive side of an adhesive tape mounted on a wafer ring chips separated by dicing a wafer so as to adhere the chips thereon, and sequentially peeling the chips off the adhesive tape to be carried. The pickup device comprising a thrusting mechanism configured to thrust the chips sequentially by using pins from a back side of the adhesive tape with the adhesive tape between the chips and the pins so as to peel the chips off the adhesive tape; a carrying mechanism configured to sequentially absorb the chips with use of a collet, hold the chips to be absorbed until the chips are peeled off the adhesive tape, thereafter pick the chips up by ascending the collet in order to be carried the chips to a subsequent process stage; and a controller configured to control the thrust of the chip by thrusting mechanism, the controller controlling an ascend time and a descend time of the pins, and keeping a predetermined period of a time when the pins arrive at their peak.

According to an aspect of the present invention there is provide a method of manufacturing a semiconductor device adhering on an adhesive side of an adhesive tape chips separated by dicing a wafer, and sequentially peeling the chips off the adhesive tape to be carried. The method comprising thrusting the chips by using pins from a back side of the adhesive tape with the adhesive tape between the chips and the pins; absorbing the chips by descending a collet from the adhesive side of the adhesive tape to contact the chips when the chips are peeled off the adhesive tape; and causing the pins to keep thrusting, and picking the chips up by ascending the collet after the chips are peeled off the adhesive tape, in order to be carried the chips to a subsequent process stage.

According to an aspect of the present invention there is provide a pickup device comprising a thrusting mechanism having a backup holder and a pin holder configured to vertically move in the backup holder to thrust a chip adhered to an adhesive tape by using pins with the adhesive tape between the chip and the pins; a heating mechanism configured to heat the adhesive tape to decrease adhesion of the adhesive tape when the chip is peeled off the adhesive tape; and an absorbing and carrying mechanism configured to absorb and carry the chip thrust by the pins of the thrusting mechanism.

According to an aspect of the present invention there is provide a method of manufacturing a semiconductor device adhering on an adhesive side of an adhesive tape chips separated by dicing a wafer, and sequentially peeling the chips off the adhesive tape to be carried. The method comprising blowing inert gas at a high temperature to the adhesive tape simultaneously with or immediately before thrusting of thrusting pins to each of the chips so as to decrease adhesion of the adhesive tape; and sequentially carrying the chips peeled off the adhesive tape.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 1 is a sectional view schematically showing a backup holder, a pin holder, and pins of a thrusting mechanism, for explaining the conventional pickup device and the method of manufacturing a semiconductor device;

FIGS. 2A and 2B are top views for explaining the relationship between the arrangement of the pins and the through holes of the backup holder in the thrusting mechanism shown in FIG. 1;

FIGS. 7A to 7H are plan views showing various cracks occurring in the chip;

FIG. 13 is a diagram representing the sequence in peeling the chip off the adhesive tape by ascending the pins;

FIG. 14 is a diagram representing the thrusting load of the pins to compare the conventional pickup device with the pickup device of the present embodiment;

FIG. 15A is a sectional view for explaining the four-point bending test;

DETAILED DESCRIPTION OF THE INVENTION

Figure 3A:
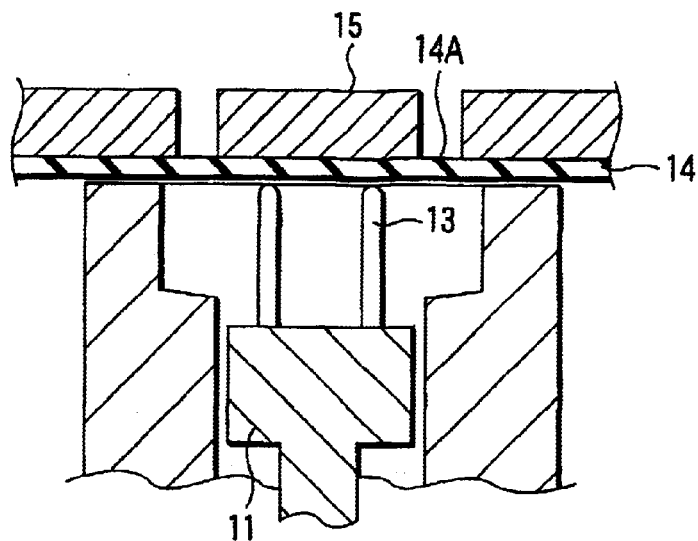
FIGS. 3A to 3C are sectional views showing step by step how the conventional chip having the thickness of 200 to 750 μm is thrusted up.
Figure 3B:
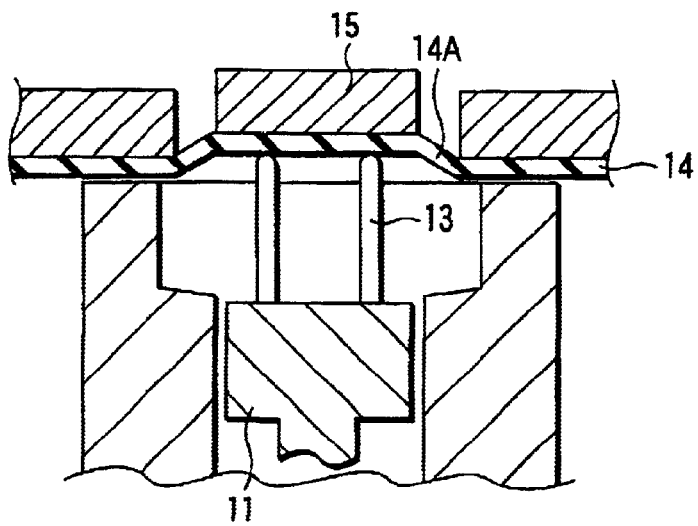
Figure 3C:
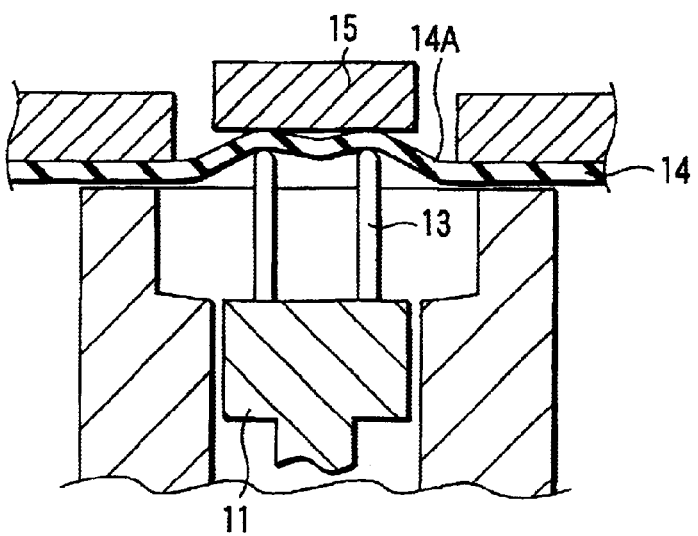
Figure 4A:
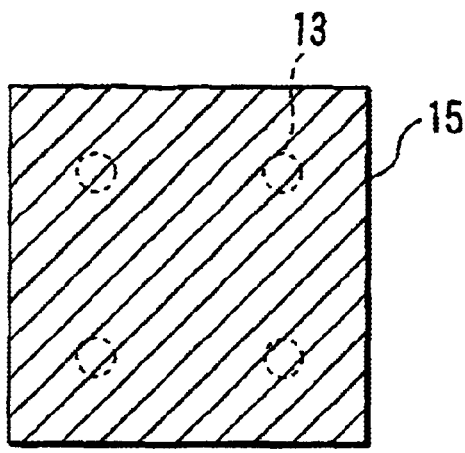
FIGS. 4A to 4D are plan views showing how the chip is gradually peeled off an adhesive tape by the thrust shown in FIGS. 3A to 3C.
Figure 4B:
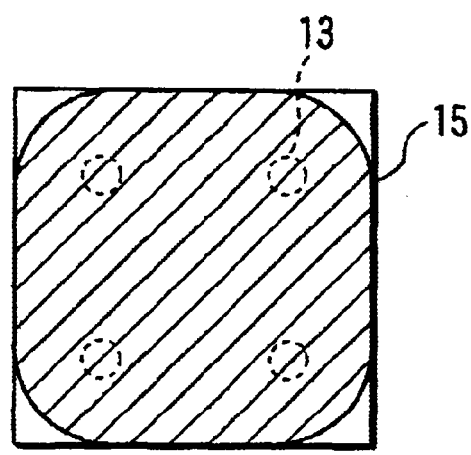
Figure 4C:
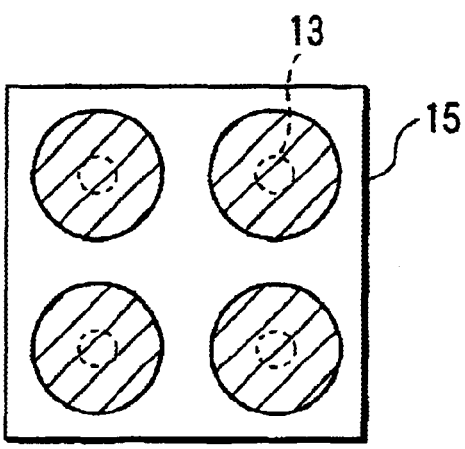
Figure 4D:
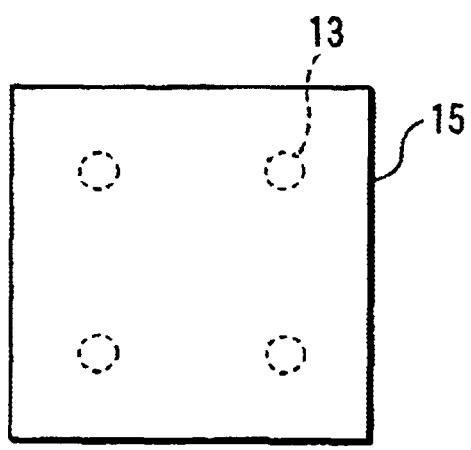
Figure 5A:
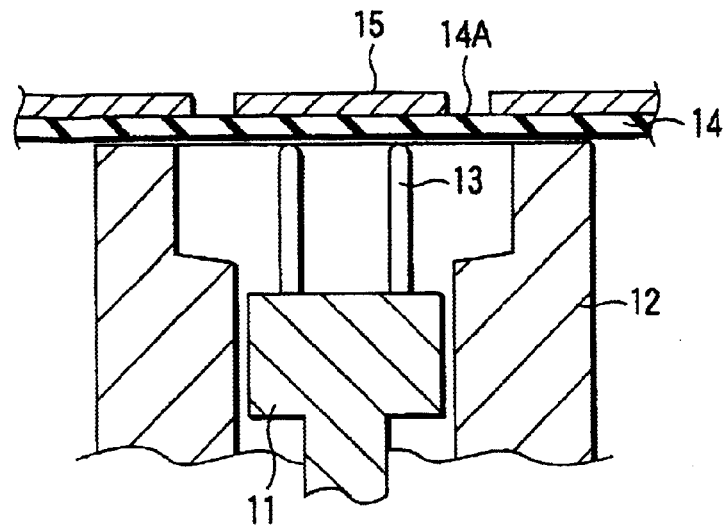
FIGS. 5A to 5C are sectional views showing step by step how a thin chip having the thickness of 40 to 100 μm is thrusted up.
Figure 5B:
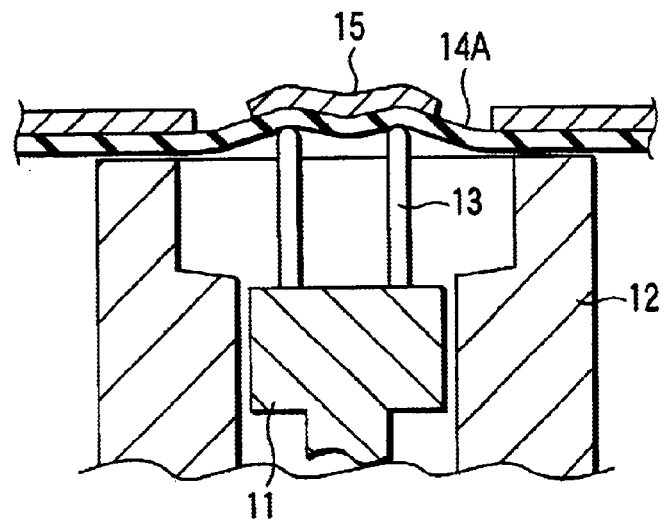
Figure 5C:
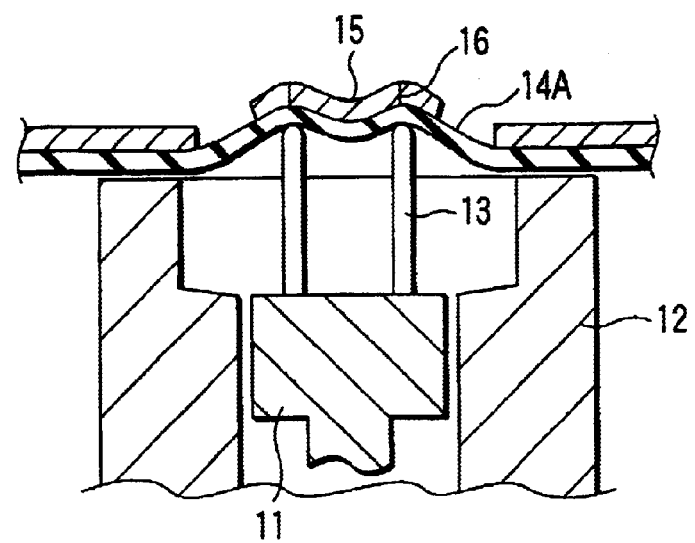
Figure 6A:
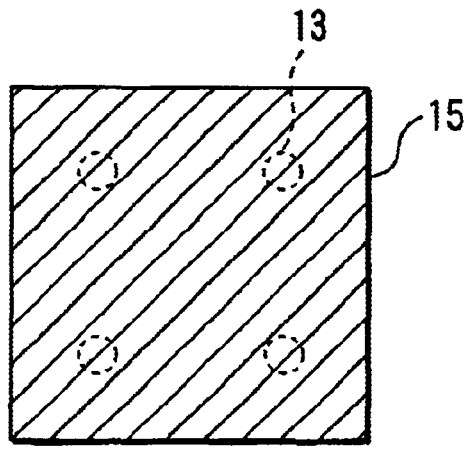
FIGS. 6A to 6C are plan views showing how cracks occur in the chip by the thrust shown in FIGS. 5A to 5C.
Figure 6B:
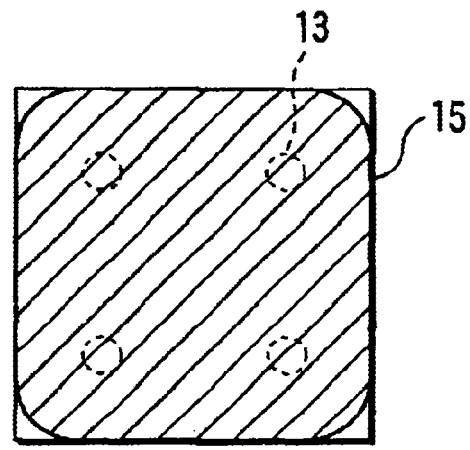
Figure 6C:
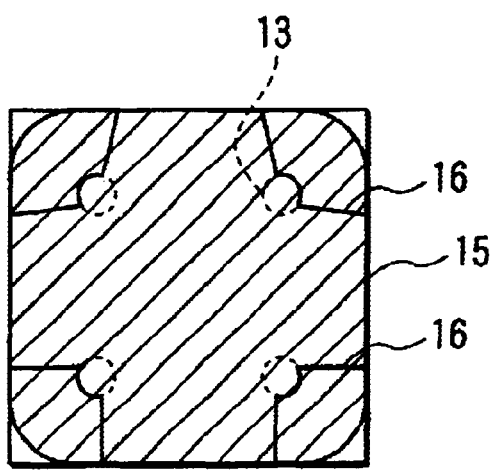
Figure 8:
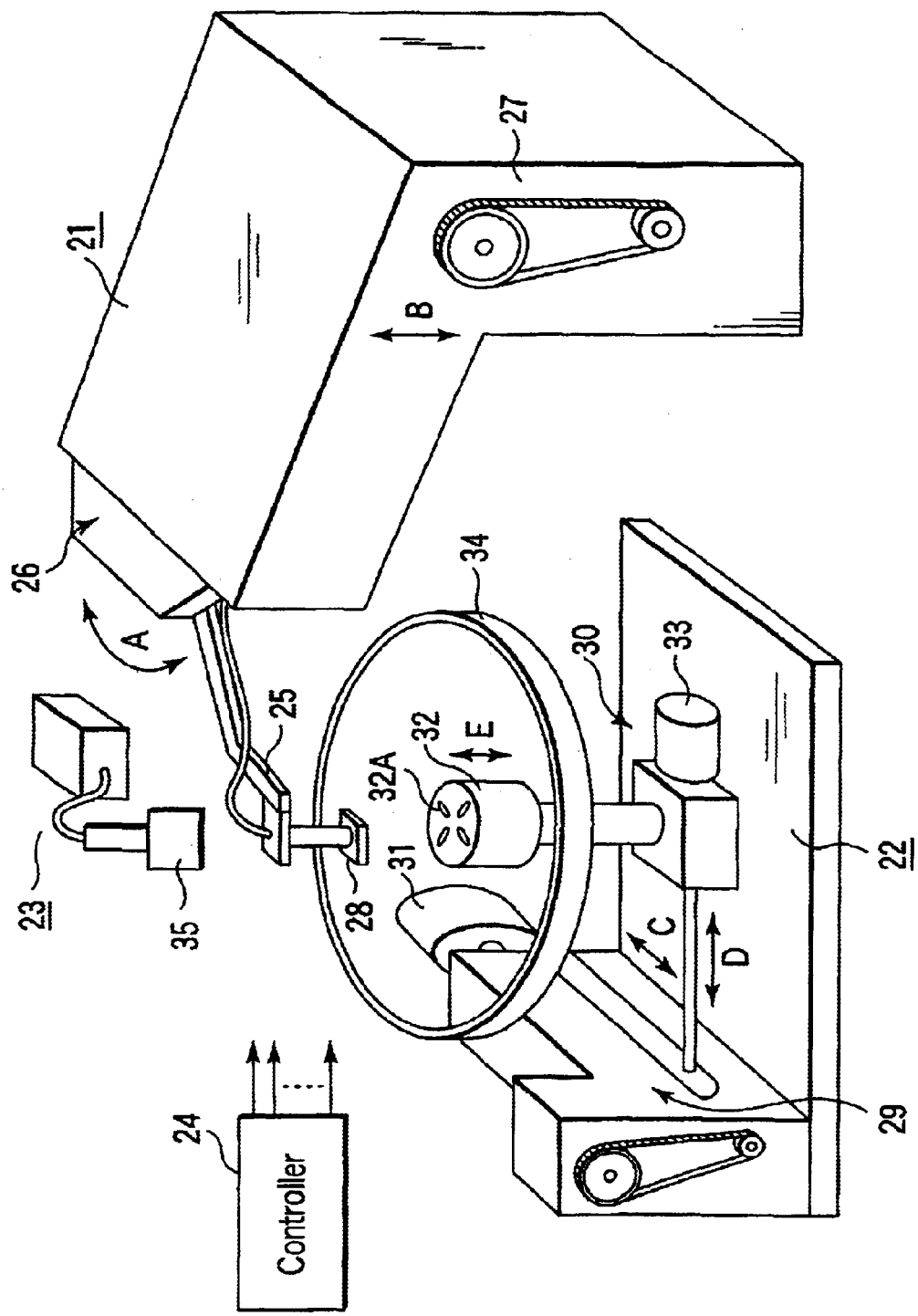
FIG. 8 is a perspective view showing an appearance of a pickup device according to a first embodiment of the present invention, for explaining the pickup device.

FIG. 8 is a perspective view showing an appearance of a pickup device according to the first embodiment of the present invention, for explaining the pickup device. The pickup device comprises a pickup mechanism 21, a thrusting mechanism 22, a chip position detecting mechanism 23, and a controller 24.

The pickup mechanism 21 has a robot arm 25, a driving section 26 for reciprocating the robot arm 25 with a fulcrum at a proximal end of the robot arm in directions indicated by arrows A, and a driving section 27 for vertically moving the robot arm 25 (in directions indicated by arrows B). The robot end is provided at the front end with a collet 28. The collet 28 directly contacts the chip and absorbs the chip with a vacuum force. With this structure, the robot arm 25 vertically moves to the position at which the robot arm picks up the chip to absorb the chip, and carries the chip.

The chip to be picked up is adhered to an adhesive tape, and it is thus difficult to pick up the chip only with the vacuum force. The pickup can be performed by strengthening the vacuum force or by mechanically seizing the chip, but the chip may be chipped or cracked and the quality thereof may be deteriorated. In order to aid the picking up by the robot arm, the thrusting mechanism 22 is used to peel the chip off the adhesive tape. A driving section 29 for freely moving a backup holder 32 on a face of a wafer ring, and a driving section 30 for moving the thrusting pins (also referred to as pickup needles) vertically are provided to the thrusting mechanism 22 side. The driving section 29 moves the backup holder 32 with use of a motor 31 or the like in directions indicated by arrows C and in directions indicated by arrows D, orthogonal to the arrows C. The backup holder 32 has through holes 32A. A motor 33 in the driving section 30 moves the thrusting pins vertically (in directions indicated by arrows E), thereby the pins are projected from the through holes 32A to thrust the chip and peel the chip off the adhesive tape.

The adhesive tape is adhered to a circular member called as a wafer ring. The pickup device has a member 34 for mounting and fixing the wafer ring with high precision. The fixing member 34 not only fixes the adhesive tape but also applies tension to the adhesive tape by thrusting the adhesive tape. In picking up the chip, the adhesive tape is normally thrust by 1 to 5 mm.

The chip position detecting mechanism 23 detects the position of the chip in the wafer ring with an accuracy of ±10 $\mu$m or less on the basis of the image data obtained by a camera 35. The backup holder 32 and the robot arm 25 precisely move with an accuracy of ±20 $\mu$m or less on the basis of the positional data obtained by the chip position detecting mechanism 23.

The operations of the driving sections 26 and 27 of the pickup mechanism 21, the absorbing operation of the collet 28, the operations of the driving sections 29 and 30 of the thrusting mechanism 22 side, the detection of the positional data by the chip position detecting mechanism 23 are all controlled by the controller 24.

Figure 9:
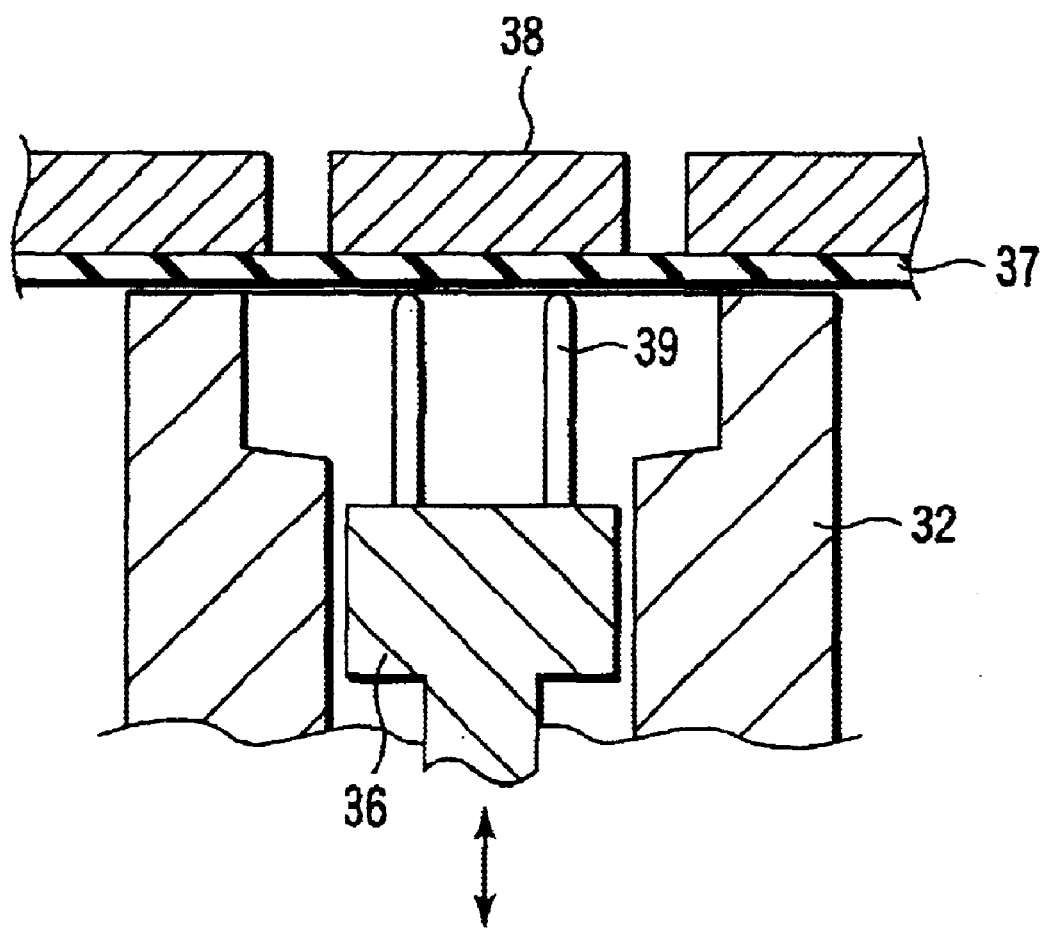
FIG. 9 is a sectional view showing a backup holder, a pin holder, and pins of a thrusting mechanism of the pickup device shown in FIG. 8.
Figure 10A:
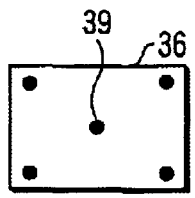
FIGS. 10A to 10Q are plan views showing various asterisk-shaped arrangements of the pins.
Figure 10B:
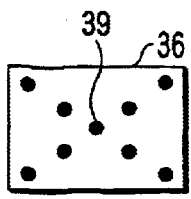
Figure 10C:
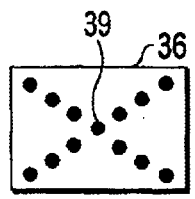
Figure 10D:
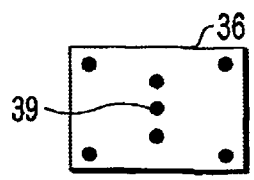
Figure 10E:
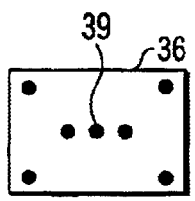
Figure 10F:
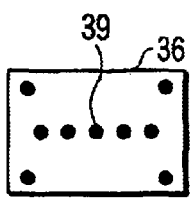
Figure 10G:
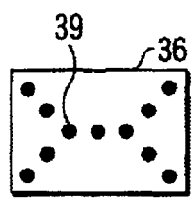
Figure 10H:
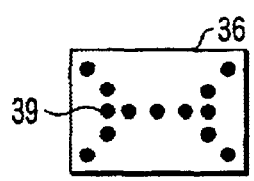
Figure 10I:
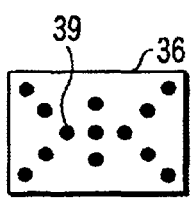
Figure 10J:
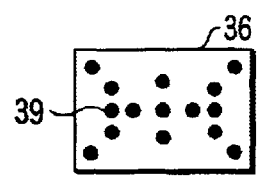
Figure 10K:
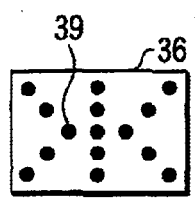
Figure 10L:
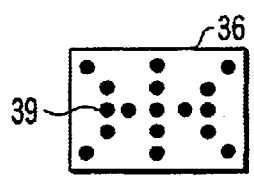
Figure 10M:
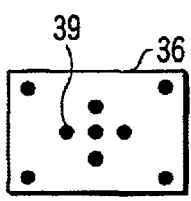
Figure 10N:
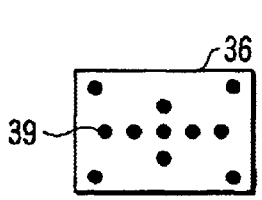
Figure 10O:
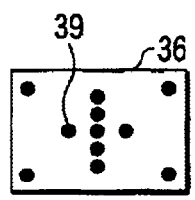
Figure 10P:
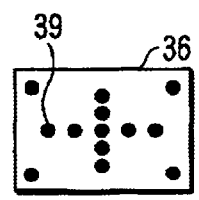
Figure 10Q:
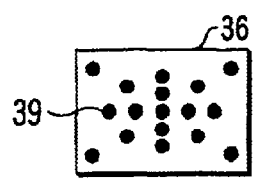
Figure 11A:
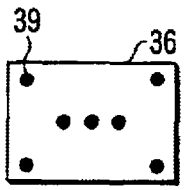
FIGS. 11A to 11R are plan views showing various linear-type arrangements of the pins.
Figure 11B:
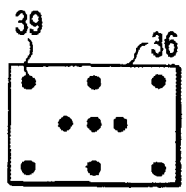
Figure 11C:
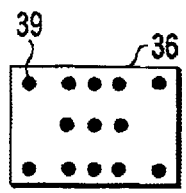
Figure 11D:
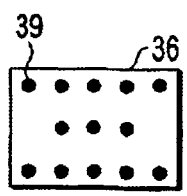
Figure 11E:
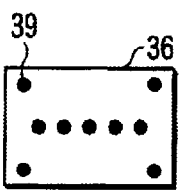
Figure 11F:
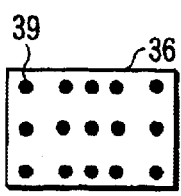
Figure 11G:
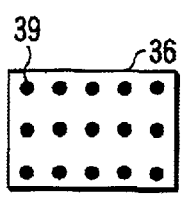
Figure 11H:
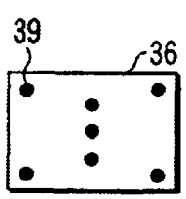
Figure 11I:
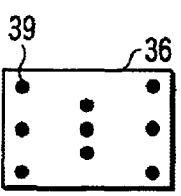
Figure 11J:
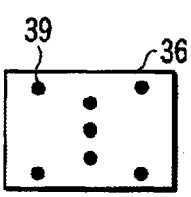
Figure 11K:
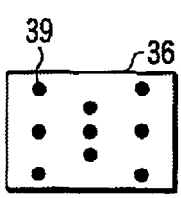
Figure 11L:
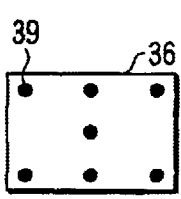
Figure 11M:
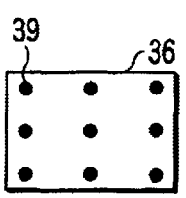
Figure 11N:
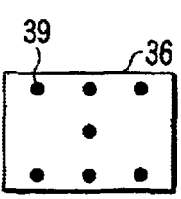
Figure 11O:
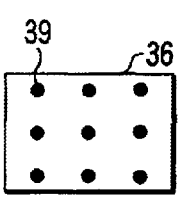
Figure 11P:
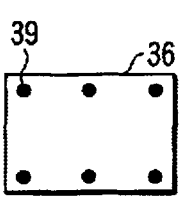
Figure 11Q:
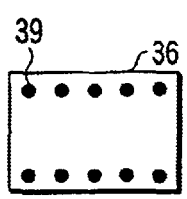
Figure 11R:
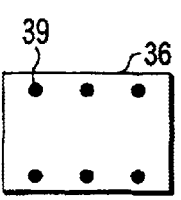

In picking up a thin chip, the thrusting mechanism 22 plays an important role. A detailed description of the thrusting mechanism 22 will be provided below in conjunction with FIGS. 9, 10A to 10Q, and 11A to 11R. FIG. 9 shows a sectional view of the backup holder, the pin holder, and the pins of the thrusting mechanism 22. FIGS. 10A to 10Q and FIGS. 11A to 11R respectively show various types of arrangements of the pins. FIGS. 10A to 10Q show asterisk-shaped arrangements of the pins and FIGS. 11A to 11R show linear-type arrangements of the pins.

FIG. 9 shows a condition where the backup holder 32 is moved below the chip to be picked up on the basis of the positional data of the chip by the driving section 29, which is obtained by the chip position detecting mechanism 23, and the chip 38 is being thrust by the ascending pin holder 36 located below the chip with the adhesive tape 37 therebetween. The pin holder 36 moves vertically in the backup holder 32, and the pins 39 are normally located such that the points of the pins are positioned at the same level as the upper face of the backup holder 32. This level is defined as 0. The pins 39 ascend from this level to thrust the chip 38 upwards with the adhesive tape 37 therebetween.

As shown in FIGS. 10A to 10Q and 11A to 11R, the number of the pins 39 is five or more, and the narrowest one of the spaces between the adjacent pins is set from 0.3 mm to 1 mm. The pins are arranged such that there is at least one group of four pins, the outer periphery of which is rectangular and two pairs of pins on the diagonals of the rectangular are symmetrical with respect to the intersection of the rectangular with an error of 100 $\mu$m or less. When the centers of the outermost pins are connected to enclose all the pins so as to put into the drawing having the same size as that of the outer periphery of the chip without protrusion, the distance from the centers of the pins to the outer periphery of the chip is set at 1.5 mm or more. Each of the pins 39 has a round tip, the radius of the curve of the tip being set from 0.5 mm to 2 mm.

With use of no less than five pins as described above, the stress applied to the chip 38 in picking up the chip 38 can be dispersed to suppress the occurrence of the cracks. The crack can be further suppressed by optimizing the distance between the pins 39 and the arrangement of the pins 39. Further, by forming the pins 38 to have a hemisphere with a radius from 0.5 mm to 2 mm at the tip end, the occurrence of the "penetration" mode of cracks can be suppressed.

Next, the method of manufacturing a semiconductor device using the pickup device having the above-mentioned structure will be described below. At first, chips are diced from a wafer, and the wafer ring on which one of the chips is mounted is fixed at the fixing member 34 of the wafer ring in the pickup device shown in FIG. 8.

The dicing process to supply the chip to the pickup device will be described at first.

After forming circuits in the wafer in a well-known process, the wafer is diced to obtain separate chips. The dicing is performed normally after grinding the back side of the wafer thinner. In this process, the back side chipping may easily occur on the back side of the wafer. The term "back side chipping" means the phenomenon that fine cracks are made in the back side of the wafer. More precisely, the cracks develop at the interface between the silicon wafer and the adhesive tape as the adhesive tape warps immediately before the wafer on the tape is cut into chips. The back side chipping may cause the chip to break. It also goes without saying that the back side chipping adversely affects the strength of the chip, and it can be said that the chip with less back side chippings has a high quality. The back side chipping is a serious problem for a thin chip.

Figure 12:
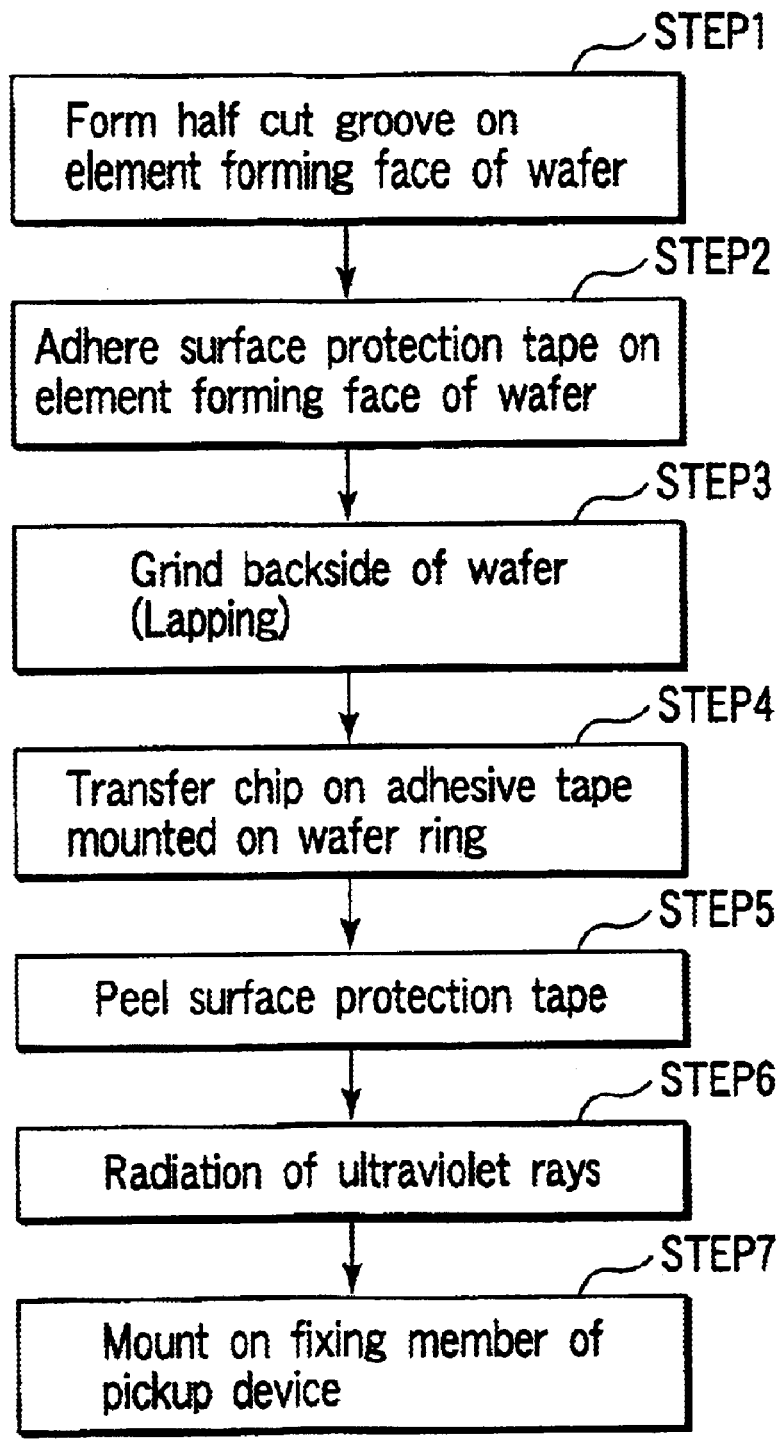
FIG. 12 is a flow chart of a prior dicing process.

The method capable of suppressing the back side chipping is a "prior dicing process" (also referred to as DBG: Dicing Before Grinding) presented below. FIG. 12 is a flow chart of the prior dicing process. In the prior dicing process, a half cut groove is formed along a dicing line or a chip separation line for separating chips (STEP 1). It should be noted that the cutting will not penetrate through to the back side of the wafer. This method is also called as a half cut dicing since the cutting is performed to penetrate through to the back side of the wafer in the normal dicing. The cutting depth is set larger than the final thickness of the chip by 10 to 30 $\mu$m. The cutting depth depends on the precision of the dicer and the grinder.

The flow chart of FIG. 12 represents the method which dose not use a dicing tape since the method is used for the device for carrying the wafer, but the dicing tape may be used, of course. The dicing tape is used to fix the wafer to a tape in advance in order to space the chips apart after the dicing. The base of the dicing tape is formed of a plastic such as vinyl chloride or polyolefin. The dicing tape is classified into two types: a tape the surface of which is made rough to have self-adhesion; and a tape applied with thin adhesion. The adhesion of the latter can be selectively changed. It is preferable that the tape holds the wafer firmly in dicing and that the tape can be easily peeled off the chip in picking up the chip so as not to damage the chip. The adhesive is preferable to have antinomy in this manner, and thus such an adhesive is used of which the adhesion is decreasable by the action of ultraviolet rays or heating. The adhesive peeled after the radiation of ultraviolet rays is mainly composed of epoxy resin and acrylic resin which is hardened by radical polymerization. The adhesive peeled after the heating is mainly composed of silicone resin that is turned to foam by heating.

Whether or not the dicing tape is used is dependent on the structure of the device. If the dicing tape is to be used for the device, the wafer is carried mounted on the wafer ring. The wafer is thus adhered to the dicing tape in advance and supplied to a dicer (a dicing device).

Next, a tape is adhered to an element forming face of the wafer subjected to the half cut dicing (STEP 2). This tape is called a "surface protection tape". The tape is adhered to the surface of the wafer in order to prevent any damage to the elements in the wafer in the process of grinding the back side of the wafer to be formed thinner.

After the tape is adhered to the wafer, the grinding (lapping) of the back side of the wafer (STEP 3) is performed. The grinding is a process of grinding the back side of the wafer to a predetermined thickness by rotating a so-called wheel having a grindstone at a high speed of 4000 to 6000 rpm. The grindstone is formed of powder of artificial diamond congealed with phenolic plastic. The grinding is normally performed with use of two grinding axes. In some cases, the wafer is roughly ground with use of a grinding axis having a grindstone of Nos. 320 to 600, and then with use of two grinding axes having grindstones of Nos. 1500 to 2000 to form a mirror surface on the wafer. The grinding using three axes may be also acceptable.

The chips subjected to the grinding process are transferred to an adhesive tape mounted on the wafer ring (STEP 4). The adhesive tape is called a "pickup tape" (or a transfer tape). The pickup tape is often formed of vinyl chloride series or acrylic series plastic. It is preferable that such a pickup tape is formed of acrylic series plastic and of which the adhesion is decreased by the radiation of ultraviolet rays. It is required that the pickup tape easily transfers and carries securely the chips and peels when the chips are picked up. In transferring and carrying the chips, it is preferable for the tape to hold the chips securely so as not to move the chips, but in picking up the chip, it is preferable for the tape to be easily peeled off the chip. The adhesion of some of the acrylic tapes is decreased by the radiation of ultraviolet rays. Such a tape has selective adhesion before and after the radiation of ultraviolet rays and thus is suitable as a tape used for a thin chip. As the most popular pickup tape, a vinyl chloride series tape such as HAL-1503 or HAL-1603 made by HITACHI CHEMICAL CORPORATION, or G-11 or G-15 made by LINTEC CORPORATION is frequently used. An acrylic UV tape such as D-105 made by LINTEC CORPORATION may be also acceptable.

After peeling the surface protection tape (STEP 5), the treatment such as the radiation of ultraviolet rays is performed for the pickup tape to decrease the adhesion (STEP 6), and the chips adhered to the pickup tape are mounted on the fixing member 34 of the wafer ring in the pickup device (STEP 7).

According to the prior dicing method, the problem that may occur in the normal dicing will not occur, and thus the chipping on the back side of the chip can be decreased remarkably. The prior dicing method is particularly suitable for a thin chip and the flexural strength of the chip can be improved thereby.

The pickup device and the method of manufacturing a semiconductor device according to the present embodiment are intended to pick up thin chips separated by the prior dicing process.

At first, the chip position detecting mechanism 23 detects the position of the chip to be picked up on the basis of the image data obtained by a camera 35, controlled by the controller 24. The backup holder 32 is moved by the thrusting mechanism 22 on the basis of the positional data obtained by the chip position detecting mechanism 23 and the collet 28 provided at the front end of the robot arm 25 is moved to the detected position.

The pickup operation is then performed by ascending the pins 39 in accordance with the sequence as shown in the graph of FIG. 13, controlled by the controller 24. FIG. 13 represents the sequence according to the present embodiment and the conventional sequence to enable a comparison. According to the conventional pickup device, the pins thrust the chip with a tape therebetween, and when the pins arrive at their peak (top dead center) and stop, the pins descend immediately. On the other hand, according to the method of manufacturing a semiconductor device of the present embodiment, the speed of the pins increases gradually from the stopping position (height 0), and then become constant. The speed of the pins of the present embodiment gradually decreases near the peak, and immediately becomes zero when the pins arrive at their peak. The leaving period ΔT of time is preferably 0.01 to 10 seconds if the chip is 100 μm or less thick. If the pins are moving near the top dead center at a sufficiently low speed, it need not be stopped. The pins will soon stop at its stopping position (height 0).

If the ascending speed of the thrusting pin 39 is so high, the chip 38 will be cracked. It is thus preferable to set the ascending speed of the thrusting pin 39 for a chip having a thickness of 100 μm or less within a range of 0.1 to 5 mm/second at a constant speed, and most preferably, within a range of 0.1 to 1 mm/second, though it varies according to the type of pickup device. The stroke of the thrusting pins 39 is preferably set at 0.1 to 2 mm on the basis of the upper surface of the backup holder 32.

In the conventional pickup device, the ascending speed of the thrusting pin 39 is set within a range of 100 μm–1000 μm/second at a constant speed. The thrusting stroke is set at 1–5 mm on the basis of the upper surface of the backup holder. The thrusting operation of the pins and the descending operation of the collet are performed at the same time. When the thrusting pins arrive at the peak, the collet 28 contacts the chip to absorb it.

According to the method of manufacturing a semiconductor device of the present embodiment, the pins 39 does not descend immediately after the pins 39 arrive at the peak, but remain there for a period. By leaving the pins for a while, the peeling-off of the chip 38 can be facilitated. According to the pickup device of the present embodiment, the leaving period ΔT of time can be set within a range of 0 to 10 seconds. After the end of the leaving period of time, the collet 28 starts ascending to be carried the chip 38 to a predetermined place.

In the ascending of the pins 39 according to the sequence shown in FIG. 13, the thrusting load is set as shown in FIG. 14. As should be clear from the graph of FIG. 14, the thrusting load according to the conventional method arrives at the peak immediately before the chip 38 is peeled off the adhesive tape 37. On the other hand, according to the device and the method of the present embodiment, the thrusting load has two peaks both of which are less than the peak of the conventional device and the conventional method. As the result, the deformation of the chip 38 is decreased, and the flexural strength of the chip 38 can be improved in comparison with the conventional device and the conventional method.

FIG. 15A is a diagram explaining the four-point bending test. In the test support members P1 and P2 contact one surface of the chip 38. At the same time, support members P3 and P4 contact the other surface or the chip 38 and bending jig 50 applies a load to the chip 38 via the members P3 and P4 in the direction of arrow F. The flexural load exerted in this condition is measured. The flexural strength σ (MPa) can be given as follow, based on the theory of material strengths:

$$\sigma = 3aF/bh^2$$

where "F" is the load (N) that breaks the chip 38, "a" is the distance (m) between the points of force, "b" is the distance (m) between the fulcrums, and "h" is the thickness (m) of the chip 38.

Figure 15B:
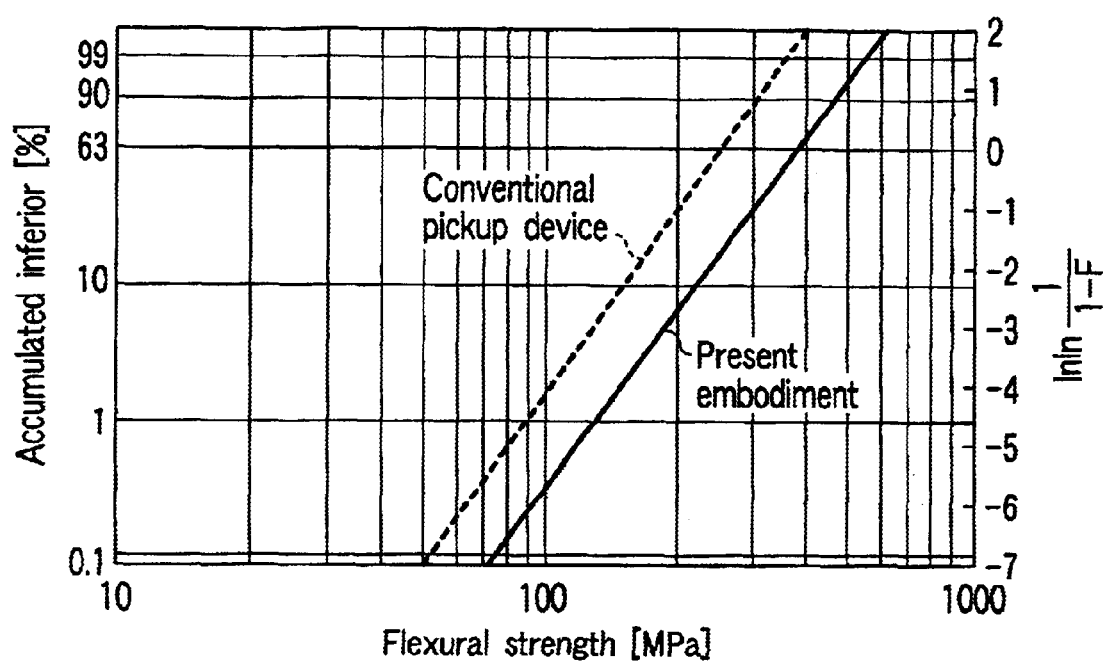
FIG. 15B is a weibull distribution representing the bending resistance of the chip to compare the conventional pickup device with the pickup device of the present embodiment.

FIG. 15B shows the Weibull distribution in the pickup device, obtained from the four-point bending test and the above equation. FIG. 15B also shows the Weibull distribution observed in the conventional pickup devise. Obviously, the flexural strength of the chip 38 is far greater in the present embodiment than in the conventional device and method.

After the pickup process, the chip will be contained in a tray or die-attached. When the chip is contained in a tray, the robot arm 25 is moved to contain the chip directly into the tray. When the chip is die-attached, the robot arm 25 is moved to mount the chip on a predetermined position on a lead frame or a mounting substrate.

According to the pickup device having the above-mentioned structure, the controller controls the vertical movement of the pins in picking up the chip so as to leave the pins for a predetermined period of time, and thus the peeling-off of the controller can be facilitated. In other words, the chip can be peeled off the adhesive tape with a small load, not by force. With the result, damage such as cracks can be suppressed in picking up a thin chip, and thus the quality of the chip can be enhanced.

Further, according to the method of manufacturing a semiconductor device mentioned above, the pins are left thrusting the chip until the chip is peeled off the adhesive tape, and the peeling-off of the controller can be facilitated thereby. In other words, the chip can be peeled off the adhesive tape with a small load, not by force. With the result, damage such as cracks can be suppressed in picking up a thin chip, and thus the quality of the chip can be enhanced and the yield can be improved.

Next, the pickup device and the method of manufacturing a semiconductor device according to the second embodiment of the present invention will be described below. The gist of the second embodiment is to facilitate the peeling of the chip off the adhesive tape. More specifically, the second embodiment intends to facilitate the pickup operation by partially heating the adhesive tape to decrease the adhesion. It is important in the heating operation to heat instantaneously. By performing the heating operation in such a short period of time, the pickup operation can be performed without adversely affecting the manufacturing efficiency.

Figure 16:
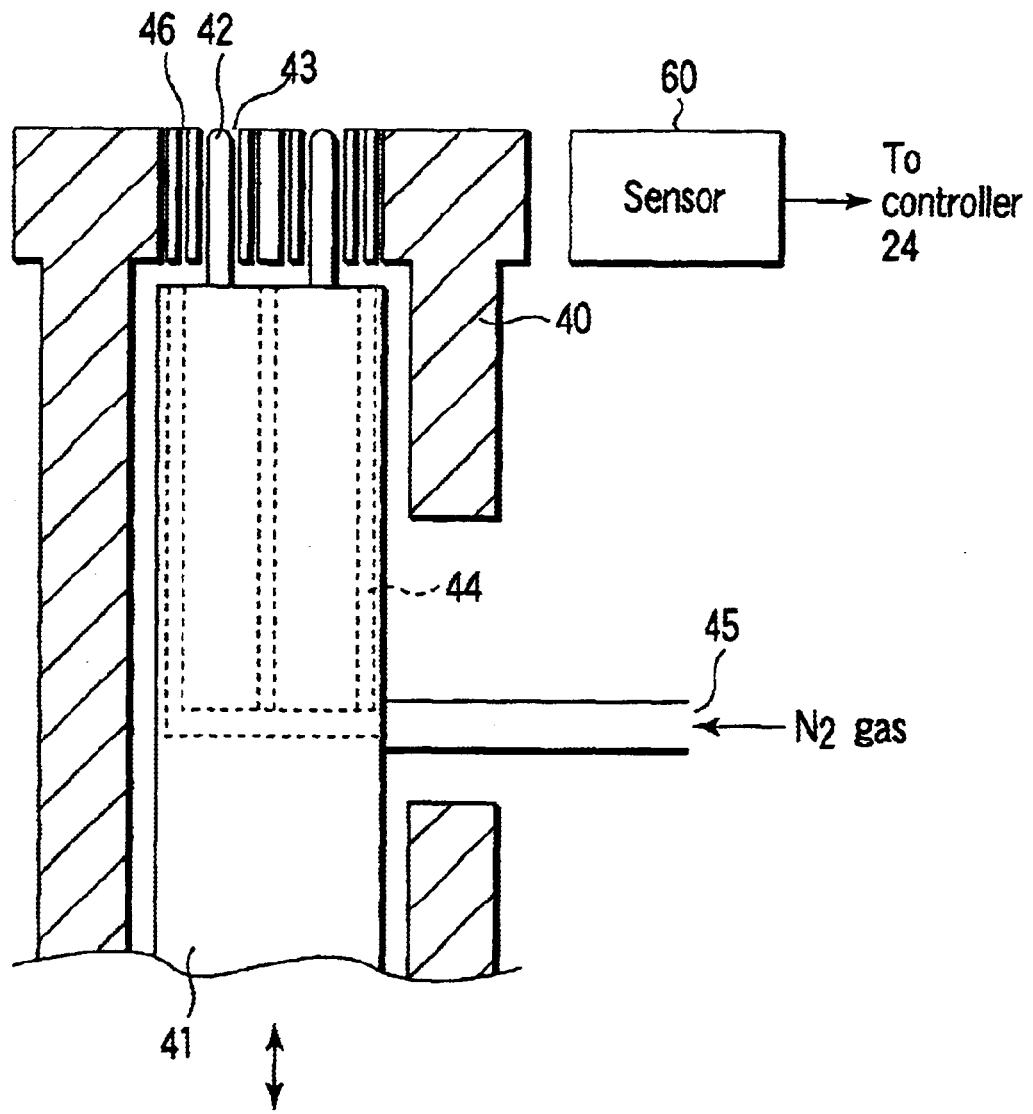
FIG. 16 is a sectional view for explaining a pickup device and a method of manufacturing a semiconductor device according to a second embodiment of the present invention, and showing a backup holder, a pin holder, and pins of the other structure of the thrusting mechanism shown in FIG. 8.

FIG. 16 is a sectional view for showing a backup holder, a pin holder, and pins of the other structure of the thrusting mechanism shown in FIG. 8. A backup holder 40 is provided with vacuum pipes for absorbing an adhesive tape to fix by a vacuum pressure. A pin holder 41 is contained in the backup holder 40 and vertically moves therein. The pin holder 41 is fixedly provided on the upper surface with thrusting pins 42 to protrude from through holes 43 formed on the backup holder 40. In the pin holder 41, glass capillaries 44 extend vertically parallel with the pins 42 and a gas inlet 45 for a high temperature inert gas is fixed to the pin holder 41. The high temperature inert gas, such as nitrogen ($N_2$) gas at a temperature of 200 to 400° C. is introduced from the inlet 45 and led through the capillaries 44 and through holes 46 formed on an upper surface of the backup holder 40 to the back side of the adhesive tape. It is preferable to blow the nitrogen gas to the adhesive tape immediately before the thrusting by the ascending of the pin holder 41 or at the same time as the ascending. A delay time from supply of the inert gas to the start of the thrust operation of the pins is controlled by the controller 24. Further, a time from supply of the inert gas to end of the supply is controlled by the controller 24. A sensor 60 may be provided for detecting a heated temperature of the adhesive tape. Output signal of the sensor 60 is supplied to the controller 24 for stopping supply of the inert gas when the heated temperature of the adhesive tape is detected.

The capillaries 44 shown in FIG. 16 do not protrude from the upper surface of the pin holder 41, but may protrude therefrom.

Figure 17A:
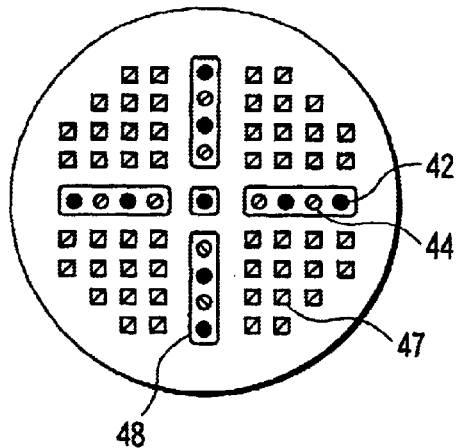
FIG. 17A is a plan view showing an arrangement of the pins, the capillaries and the vacuum holes on the upper surface of the pin holder.

FIG. 17A shows an arrangement of the through holes of the thrusting pins 42 and capillaries 44, and vacuum holes connected to the vacuum pipes on the upper surface of the pin holder 41. As shown in the drawing, the through holes of the thrusting pins 42 and the capillaries 44 are alternately arranged in each of the long holes 48. The long holes are arranged in a cross. The vacuum holes 47 are arranged at a regular interval between the long holes 48.

Figure 17B:
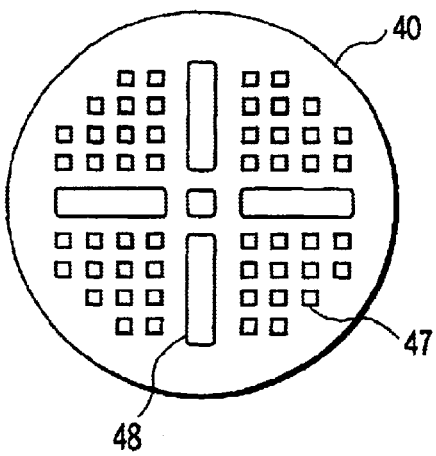
FIG. 17B is a plan view showing an arrangement of through holes on the face on which the backup holder contacts with the adhesive tape.

FIG. 17B shows an arrangement of the through holes 43 and 46 and the vacuum holes 47 on the upper surface of the backup holder 40. At the face shown in FIG. 17B, the backup holder 40 contacts the adhesive tape. There are arranged on this upper surface of the backup holder 40 the long holes 48 and the vacuum holes 47 so as to correspond to the upper face of the pin holder 41.

With the above-mentioned structure, the adhesion of the adhesive tape can be decreased by heating the adhesive tape immediately before the pickup operation, thereby the chip can be easily picked up. Further, the inert gas at a high temperature can heat the adhesive tape instantaneously, and the heating time can be limited only when the gas is blown, and thus the adhesive tape can be cooled down in a short period of time. With such a process, high manufacturing efficiency can be enjoyed.

Figure 18A:
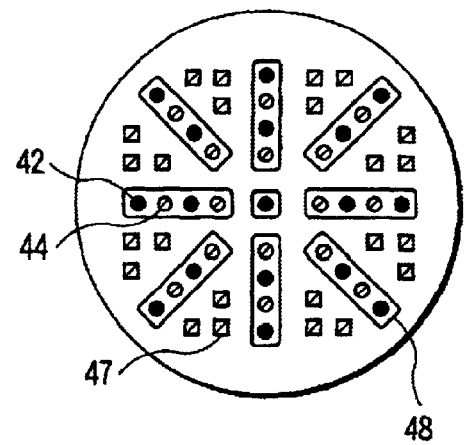
FIG. 18A is a plan view showing the other arrangement of the pins, the capillaries and the vacuum holes on the upper surface of the pin holder.

FIG. 18A shows the other arrangement of the through holes of the thrusting pins 42 and capillaries 44, and the vacuum holes 47 on the upper surface of the pin holder 41. As shown in the drawing, the long holes 48 are arranged divergently.

Figure 18B:
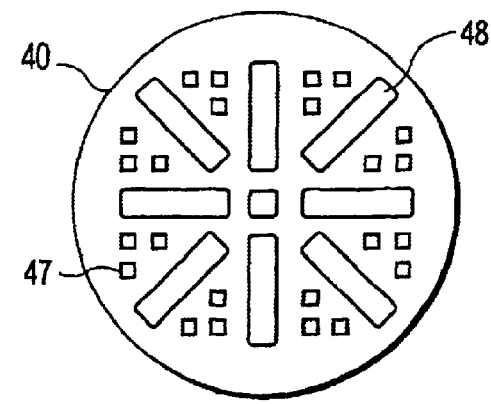
FIG. 18B is a plan view showing the other arrangement of through holes on the face on which the backup holder contacts the adhesive tape.

FIG. 18B shows the other arrangement of the through holes 43 and 46 of the thrusting pins 42 and capillaries 44, and the vacuum holes 47. There are arranged on this upper surface of the backup holder 40 the long holes 48 and the vacuum holes 47 so as to correspond to the upper face of the pin holder 41.

With such a structure, the number of pins 42 increases, and thus the stress applied to the chip can be dispersed, thereby the occurrence of cracks can be suppressed.

Consequently, according to the pickup device having the above-mentioned structure, the adhesion of the adhesive tape can be decreased by heating the adhesive tape instantaneously, thereby the chip can be easily peeled off the adhesive tape without any damage to the chip. As a result, damage such as cracks can be suppressed in picking up a thin chip, and thus the quality of the chip can be enhanced.

Similarly, according to the method of manufacturing a semiconductor device explained above, the adhesion of the adhesive tape can be decreased by heating the adhesive tape instantaneously, thereby the chip can be easily peeled off the adhesive tape without any damage to the chip. As a result, damage such as cracks can be suppressed in picking up a thin chip, and thus the quality of the chip can be enhanced and the yield can be improved.

In the above-mentioned second embodiment, the adhesion of the adhesive tape is decreased by blowing an inert gas at a high temperature onto the adhesive tape. In another case, a heater may be provided at the backup holder and controlled to heat the adhesive tape. The same effect can be attained by using a sheet-like heater or a rod-like heater attached to the backup holder to heat the adhesive tape.

With this method, however, the heater cannot be cooled down and thus the manufacturing efficiency may be deteriorated in comparison with the case of using an inert gas at a high temperature. The heater needs to be cooled down since the deterioration of the tape such as shrink of the tape may be caused if the heating treatment is performed for a long time, which may lead to damage of the chip.

Additional advantages and modifications will readily occur to those skilled in the art. Therefore, the invention in its broader aspects is not limited to the specific details and representative embodiments shown and described herein. Accordingly, various modifications may be made without departing from the spirit or range of the general inventive concept as defined by the appended claims and their equivalents.

What is claimed is:

1. A method of manufacturing a semiconductor device, comprising:

adhering on an adhesive side of an adhesive tape chips separated by dicing a wafer; and repeating a step of peeling a chip off the adhesive tape to sequentially peel the chips off the adhesive tape, wherein the step of peeling a chip off the adhesive tape comprises:

blowing inert gas at a high temperature to the adhesive tape so as to decrease adhesion of the adhesive tape;

thrusting the chip using pins from a back side of the adhesive tape with the adhesive tape between the chip and the pins, and keeping the pins at a peak position for an amount of time in the range of 0.01 to 10 seconds to facilitate peeling the chip off the adhesive tape, wherein the pins do not pierce the adhesive tape;

descending a collet from the adhesive side of the adhesive tape to contact and suck the chip when the chip is peeled off the adhesive tape; and picking the chip up by ascending the collet.

2. The method of manufacturing a semiconductor device according to claim 1, prior to the thrusting the chips by using pins from the back side of the adhesive tape, optically detecting a position of one of the chips, which is to be peeled off;

moving the pins to the detected position of the one of the chips; and absorbing and holding an opposite side of the adhesive side of the adhesive tape.

3. The method of manufacturing a semiconductor device according to claim 1, further comprising forming a half cut groove on an element forming face of the wafer along one of a dicing line and a chip separation line such that the groove does not penetrate through to a back side of the wafer, and then grinding the back side of the wafer to separate the chips.

4. The method of manufacturing a semiconductor device according to claim 1, wherein when each of the chips is peeled off the adhesive tape the pins move from an original position such that a moving speed gradually increases and becomes constant thereafter, then decreases gradually to stop, then the pins back to the original position.

5. The method of manufacturing a semiconductor device according to claim 1, wherein a thickness of each of the chips is no more than 100 $\mu$m, and a speed at which the pins thrust the chips with the adhesive tape therebetween is set to be a constant within a range from 0.1 mm/s to 1 mm/s.

6. The method of manufacturing a semiconductor device according to claim 1, wherein a stroke by which the pins thrust the chips with the adhesive tape therebetween is set within 0.1 to 2 mm.

\* \* \* \* \*